Aug. 27, 1963 J. ENSINK 3,102,215

VARIABLE INPUT-IMPEDANCE CIRCUIT ARRANGEMENT

Original Filed July 20, 1956

INVENTOR.
JOHANNES ENSINK
BY
Frank R. Jifari
AGENT

United States Patent Office 3,102,215

Patented Aug. 27, 1963

3,102,215

VARIABLE INPUT-IMPEDANCE CIRCUIT ARRANGEMENT

Johannes Ensink, Hilversum, Netherlands, assignor, by mesne assignments, to North American Philips Company, Inc., New York, N.Y., a corporation of Delaware

Original application July 20, 1956, Ser. No. 599,163, now Patent No. 2,952,783, dated Sept. 13, 1960. Divided and this application Apr. 12, 1960, Ser. No. 48,795

2 Claims. (Cl. 317—148.5)

This invention relates to transistor circuit-arrangements comprising a variable input impedance in order to influence the amplitude of an electrical oscillation. It is known to vary the input impedance of a transistor by varying the emitter adjustment current to which this input impedance is inversely proportional to a first approximation.

This application is a division of application Serial No. 599,163, filed July 20, 1956, now Patent No. 2,952,783, granted September 13, 1960.

The present invention utilises the variation occurring in the input impedance if the oscillation produced at the collector causes the collector voltage to drop temporarily substantially to the emitter voltage (collector limitation). In accordance with the present invention, the emitter and base electrodes of the transistor with an emitter-collector current amplification factor substantially = unity are coupled to a source of oscillations. The internal resistance of the source of oscillations, viewed between these electrodes, lies between the values of the input impedance of the transistor, measured with a collector impedance zero and infinity, respectively. The electrical oscillation is supplied to said electrodes with an amplitude sufficient to make the collector-emitter voltage substantially zero during the maxima of said oscillation the resultant varying input impedance of the transistor producing a variable damping of the source of oscillations.

The invention may be used with particular advantage in two related classes of circuit arrangements. In the first class, the invention has the feature that the transistor with an emitter-collector current-amplification factor approximately = unity is operated in common base arrangement and its emitter and base are coupled to a series-resonance circuit, the resonance resistance of which viewed between these electrodes, lies between the values of the input impedance of the transistor, measured with a collector impedance zero and infinity respectively. The electrical oscillation is supplied to said resonant circuit with an amplitude sufficient to make the collector-emitter voltage substantially zero and to cause the resultant varying input impedance of the transistor to damp the resonant circuit more heavily during the maxima of said oscillation. In the second class, the invention has the feature that the transistor with an emitter-collector amplification factor substantially = unity is operated in common emitter arrangement and its emitter and base are coupled to a parallel-resonance circuit, the resonance resistance of which, viewed between these electrodes, lies between the values of the input impedance of the transistor measured with a collector impedance zero and infinite respectively. The electrical oscillation is supplied to this resonance circuit with an amplitude sufficient to make the collector-emitter voltage substantially zero and to cause the resultant varying input impedance of the transistor to damp the resonant circuit more heavily during the maxima of said oscillation.

In order that the invention may be readily carried into effect it will now be described with reference to the accompanying drawing, in which FIG. 1 is a schematic diagram of an embodiment of the circuit arrangement of the present invention;

Figure 1:
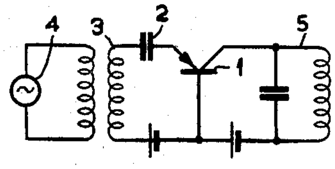

FIG. 1 shows a transistor 1 in common base arrangement, that is to say that the base is common to the input and output circuit. Connected between the emitter and the base is a series-resonance circuit comprising a capacitor 2 and an inductance 3, the latter being coupled to a signal current source 4 which corresponds to the resonance frequency of the circuit 2–3. The collector circuit furthermore comprises a parallel resonance circuit 5 tuned to the signal frequency.

Figure 2:
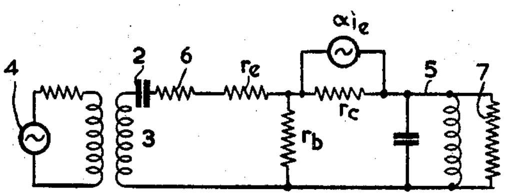
FIG. 2 is an equivalent diagram of FIG. 1.

In the equivalent diagram shown in FIG. 2, the transistor 1 is replaced in known manner by its internal resistance parameters $r_e$, $r_b$, $r_c$ and the source of current $\alpha\, i_e$, where $\alpha$ represents the collector-emitter current amplification factor which is approximately equal to unity and $i_e$ represents the emitter current. Furthermore, the circuit 2, 3, comprises a resonance resistance 6 (in which the attenuation by the generator 4 has been accounted for) and the circuit 5 comprises a resonance resistance 7.

According to a partial feature of the invention the resistance 6 has a value inbetween the values of the input resistance of the transistor at the values of the resistance 7=zero and infinity respectively. The values $r_e+r_b\,(1-\alpha)$ and $r_e+r_b$ are calculated respectively for the input resistance. The invention is based on the recognition that if the signal oscillations are supplied to the circuit 2, 3 with such a high amplitude and amplified in the transistor that the collector-emitter voltage becomes substantially zero during the maxima of said oscillations, the collector resistor $r_c$ of the transistor then changes abruptly from a considerable value (for example several megohms), and more particularly high relatively to the resistance 7, to a very low value (for example several tens of ohms) and more particularly low relatively to the resistance 7, so that in fact the aforesaid condition is satisfied, the input impedance varying from the value $r_e+r_b\,(1-\alpha)$ to $r_e+r_b$. Since $\alpha$ is substantially unity, this variation entails a considerable increase in damping of the circuit 2, 3, hence the oscillation across this circuit assumes a considerably smaller amplitude.

If, for example, the source 4 supplies an amplitude-modulated current of sufficient strength, the current passing through the transistor 1 and the voltage set up across the circuit 5 will substantially exhibit no further amplitude modulation. If desired, the signal oscillation of the source 4 may be made sufficient to urge the emitter periodically in the blocking direction relative to the base, which also involves a considerable increase in input impedance.

Figure 3:
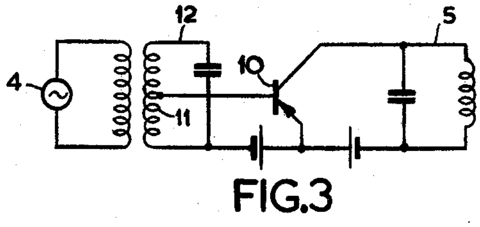
FIG. 3 is a schematic diagram of another embodiment of the circuit arrangement of the present invention.

In FIG. 3, the transistor 10 is operated in common emitter arrangement, in which the emitter and the base are coupled to a partial winding 11 of a parallel-resonance circuit 12, to which the oscillation from the source 4 is supplied. For the input impedance of the transistor a value $$\frac{r_e}{1-\alpha}+r_b$$

is now found on shorting the circuit 5, and, if the circuit 5 were to have an infinitely high resonance resistance, this input impedance would be $r_e+r_b$. The resonance resistance of the circuit 12, measured between the emitter and the base of the transistor 10, is again inbetween these two values. Hence, if the oscillation across the circuit 5 again makes the emitter-collector voltage substantially zero periodically, the input impedance of the transistor 10 varies according to the aforesaid expressions and the circuit 12 is damped more heavily. In this case, however, the driving of the base of the transistor 10 in the blocking direction reduces the damping.

Figure 4:
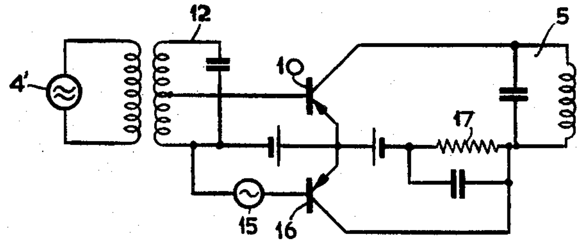
FIG. 4 is a schematic diagram of an embodiment based on that of FIG. 3.

In FIG. 4, the circuit arrangement shown in FIG. 3 is extended to form a modulation circuit arrangement, in which the source 4′ supplies a carrier oscillation to the transistor 10, while a modulating oscillation from a source 15 produces via a transistor 16 a corresponding amplified voltage across a common collector impedance 17 which, by collector limitation, limits the carrier voltage produced across the circuit 5 to a value corresponding to the modulating oscillation, so that the input impedance of the transistor 10 and consequently the oscillation across the circuit 12 also vary in accordance with said modulating oscillation.

Figure 5:
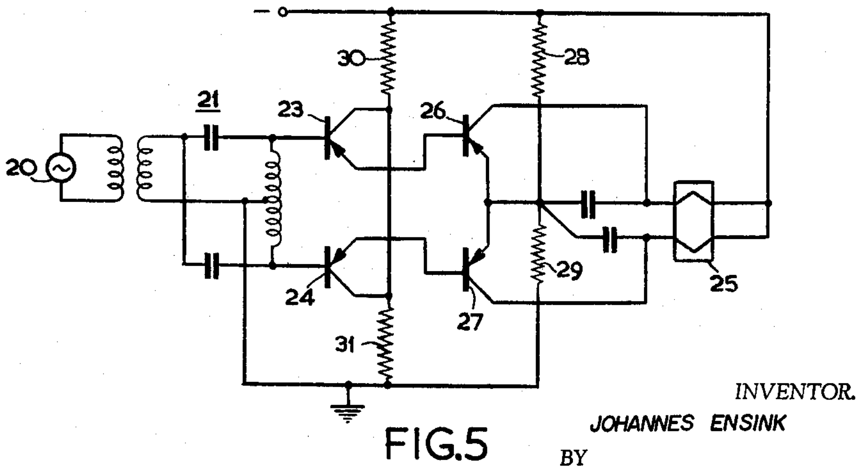
FIG. 5 is a schematic diagram of an embodiment based on that of FIG. 4.

In FIG. 5, this principle is used in a circuit arrangement for frequency-telegraphy reception. The incoming telegraph signals from the source 20 are supplied to a network 21 which is selective both in regard to the carrier frequency and the operating frequency of said signals and which supplies the oscillations of these frequencies to the base-emitter circuits of two transistors 23 and 24 respectively, the output currents of which, after detection, pass through a differential relay 25. The detection circuits comprise two transistors 26 and 27 respectively, the bases of which are connected to the emitters of the transistors 23 and 24 respectively, while their through-connected emitters are maintained at a low blocking potential by means of potentiometers 28 and 29 respectively. If the amplitude of the oscillations supplied to the transistors 23 and 24 respectively exceeds said blocking potential, a corresponding current is supplied to the relay 25 by the transistors 26 and 27 respectively. The voltage drop produced by said current across the resistor 29 involves an increase of the blocking potential produced, thus improving the trigger-sensitivity of the circuit arrangement.

Across common collector resistors 30 and 31 of the transistors 23 and 24 respectively oscillations of a sufficient amplitude are produced to make the collector voltages of the two transistors 23 and 24 substantially zero simultaneously and periodically so that again the input impedances of these two transistors are greatly reduced periodically and damp the selective network 21 more heavily. This yields an increase in insensitivity with respect to voice noise, since if the frequency of this signal oscillator is such that for example, the oscillation supplied to the transistor 23, exceeds that supplied to the transistor 24, then, upon the occurrence of said noise, when both the oscillation supplied to the transistor 23 and that supplied to the transistor 24 tend to increase, both oscillations will be attenuated to the same degree by said increased damping, so that their initial ratio and consequently the position of the relay 25 are maintained.

It will be appreciated that the circuit arrangements shown in FIGS. 4 and 5 may completely correspond to the embodiment of FIG. 1. As an alternative, circuit arrangements may be designed in which a decrease in damping of the resonance circuit occurs upon collector limitation, for example by substituting in FIG. 1 a parallel circuit for the resonance circuit 2, 3 or by substituting a series-circuit for the parallel circuit 12 in FIG. 3. If, furthermore, the circuit capacitor 2 is completely omitted in FIG. 1, the voltage produced between the emitter and the base upon collector limitation will abruptly increase with the voltage of the source 4 much more rapidly than in the absence of collector limitation, which effect may be employed for impulse triggers in television circuit arrangements.

What is claimed is:

1. A circuit arrangement comprising first and second transistors each having emitter, collector and base electrodes and an emitter-collector current amplification factor substantially equal to unity, a source of electrical oscillations, a resonant selective network having an internal input resistance viewed from the emitter and base electrodes of said first and second transistors of a value between the values of the input impedance of said first and second transistors when the collector impedance of said first and second transistors is zero and when said collector impedance is substantially infinity, said selective network being interposed between said source of oscillations and the base electrodes of said first and second transistors, said selective network comprising two portions each tuned to a different frequency, one portion being coupled to the base of said first transistor, the second portion being coupled to the base of said second transistor, said source of oscillations containing frequencies to which said selective network is tuned, and an impedance coupled in common in the collector electrode circuits of said first and second transistors, said first and second oscillations having an amplitude producing a substantially zero collector-emitter voltage simultaneously in said first and second transistors when the amplitude of said first and second oscillations is a maximum whereby said input impedance of said first and second transistors varies to provide selective variable damping of both portions of said selective network, said damping being a maximum when said oscillation amplitude is a maximum and the initial magnitude ratio of said first and second oscillations is maintained.

2. A circuit arrangement comprising first and second transistors each having emitter, collector and base electrodes and an emitter-collector current amplification factor substantially equal to unity, a source of electrical oscillations, a resonant selective network having an internal input resistance viewed from the emitter and base electrodes of said first and second transistors of a value between the values of the input impedance of said first and second transistors when the collector impedance of said first and second transistors is zero and when said collector impedance is substantially infinity, said selective network being interposed between said source of oscillations and the base electrodes of said first and second transistors, said selective network comprising two portions each tuned to a different frequency, one portion being coupled to the base of said first transistor, the second portion being coupled to the base of said second transistor, said source of oscillations containing frequencies to which said selective network is tuned, an impedance coupled in common in the collector electrode circuits of said first and second transistors, said first and second oscillations having an amplitude producing a substantially zero collector-emitter voltage simultaneously in said first and second transistors when the amplitude of said first and second oscillations is a maximum whereby said input impedance of said first and second transistors varies to provide selective variable damping of both portions of said selective network, said damping being a maximum when said oscillation amplitude is a maximum and the initial magnitude ratio of said first and second oscillations is maintained, differential relay means, and detecting means interposed between said first and second transistors and said relay means, said detecting means comprising third and fourth transistors each having emitter, collector and base electrodes, means connecting the emitter electrode of said first transistor with the base electrode of said third transistor, means connecting the emitter electrode of said second transistor with the base electrode of said fourth transistor, means connecting the emitter electrodes of said third and fourth transistors to each other and means connecting the collector electrodes of said third and fourth transistors to said relay means.

References Cited in the file of this patent

UNITED STATES PATENTS

| | | |
|---|---|---|
| 2,807,758 | Pinckaers | Sept. 24, 1957 |
| 2,828,450 | Pinckaers | Mar. 25, 1958 |
| 2,831,126 | Linvill et al. | Apr. 15, 1958 |
| 2,962,603 | Bright | Nov. 29, 1960 |